(12) United States Patent
Kimura

(10) Patent No.: US 7,375,580 B2
(45) Date of Patent: May 20, 2008

(54) SEMICONDUCTOR INTEGRATED CIRCUIT

(75) Inventor: Tomoo Kimura, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/302,372

(22) Filed: Dec. 14, 2005

(65) Prior Publication Data

US 2006/0176100 A1    Aug. 10, 2006

(30) Foreign Application Priority Data

Dec. 17, 2004    (JP)    ............... 2004-365689

(51) Int. Cl.
*G05F 1/10*    (2006.01)
(52) U.S. Cl. .................................... 327/534
(58) Field of Classification Search ................ 327/530, 327/534, 535
See application file for complete search history.

(56) References Cited

U.S. PATENT DOCUMENTS 6,031,778 A * 2/2000 Makino et al. ............ 365/226
6,333,571 B1 * 12/2001 Teraoka et al. ............. 307/125
6,469,568 B2 * 10/2002 Toyoyama et al. .......... 327/534
6,727,743 B2 * 4/2004 Kusumoto et al. .......... 327/534
6,833,748 B2 * 12/2004 Cho ............................ 327/374
7,123,076 B2 * 10/2006 Hatakeyama et al. ....... 327/534

FOREIGN PATENT DOCUMENTS

JP    2004-96073    3/2004

* cited by examiner

*Primary Examiner*—Jeffrey S Zweizig
(74) *Attorney, Agent, or Firm*—Wenderoth, Lind & Ponack, L.L.P.

(57) ABSTRACT

A semiconductor integrated circuit having a circuit block including a MOS transistor that includes a bias input terminal, a source, and a substrate, in which the bias voltage is applied to the MOS transistor at a position of at least one of the source and the substrate through the bias input terminal, a setting unit operable to set up applying timing and releasing timing at which the bias voltage is applied to and released from the MOS transistor, and a bias voltage-applying unit operable to apply the bias voltage to the MOS transistor at the applying timing and the releasing timing. In the semiconductor integrated circuit, the setting unit sets up, as the releasing timing, timing prior to activation timing by a predetermined time period. An operation-requesting signal, to be sent out to the circuit block by the setting unit, is activated at the moment of the activation timing.

13 Claims, 6 Drawing Sheets

US 7,375,580 B2

SEMICONDUCTOR INTEGRATED CIRCUIT

BACKGROUND OF THE INVENTION

1. Field of the Invention

The present invention relates to a semiconductor integrated circuit operable to suppress a leak current in a MOS transistor with a reduced influence on operating time of the circuit.

2. Description of the Related Art

A MOS transistor having a gate length of 62 nm or less brings about an increase in short channel effect-caused leak current in the MOS transistor. A semiconductor circuit device consumes electrical power equal in value to a total of a dynamic component such as switching and charge/discharge associated with the operation of the circuit, and a statistic component such as the leak current.

The 65 nm or more semiconductor process art is operable to reduce the power source voltage of the circuit in response to a reduction in threshold voltage of the MOS transistor, thereby reducing dynamic consumption current, with a consequential reduction in power consumption. However, for the 65 nm or less semiconductor process art, the leak current in the MOS transistor accounts for a large percentage of the total consumption current.

A leak current-suppressing method includes a step of reducing the power source voltage or applying bias voltage to either a source or substrate of the MOS transistor. However, the reduced power source voltage results in reduced driving capability of the MOS transistor, and the circuit is thereby operated at lower speed.

An improved semiconductor integrated circuit designed to consume less electrical power is proposed by cited Reference No. 1 or published Japanese Patent Laid-Open No. 2004-96073 (FIGS. 1 and 4).

Referring to FIG. 11, a prior art semiconductor integrated circuit is illustrated in block diagram form. Referring to FIG. 12, a course of action provided by the prior art semiconductor integrated circuit is illustrated in flowchart form. FIGS. 11 and 12 are disclosed in cited Reference No. 1.

The semiconductor integrated circuit includes a processor 100, an operating mode control unit 101, and a bias-switching circuit 102. The processor 100 is of a dual mode type: a waiting mode in which the leak current is suppressed; and a regular mode in which the circuit is usually operated. The operating mode control unit 101 has control of a switchover of the processor 100 between the waiting and regular modes. The operating mode control unit 101 includes a timer 103.

When switching over the processor 100 from the regular mode to the waiting mode, the operating mode control unit 101 notifies the bias-switching circuit 102 of the switchover. The bias-switching circuit 102 changes a value of the bias voltage when the processor 100 is in the waiting mode. The bias voltage is to be applied to the MOS transistor at either a source or substrate terminal thereof. While the bias voltage is applied to the MOS transistor, a difference in potential between the source of the MOS transistor and a gate thereof is reduced to reduce the leak current, thereby providing reduced power consumption.

When the bias voltage is changed in value, then there is a need to charge and discharge parasitic capacity that accompanies the MOS transistor at the source or substrate thereof. The circuit is rendered inoperative during the charge and discharge of the parasitic capacity, and the processor 100 is deactivated during that time. The timer 103 measures a period of time in which the parasitic capacity is charged and discharged, thereby practicing time management. When the period of time as managed by the timer 103 is terminated, then the processor 100 starts a course of action. In other words, the processor 100 still remains inoperative during a period of time in which the parasitic capacity must be charged and discharged, even when the processor 100 is switched over from the waiting mode to the regular mode.

As shown by the flowchart of FIG. 12, the switchover from the waiting mode to the regular mode is completed after timer-out or the elapse of the time period measured by the timer 103. The semiconductor integrated circuit as disclosed by cited Reference No. 1 makes it feasible to balance low power consumption with operating speed.

However, according to the prior art, the parasitic capacity accompanying the MOS transistor must be charged and discharged when the processor 100 is switched over from the waiting mode to the regular mode. As a result, the circuit, including the processor 100, cannot be operated during such a period of time as to require the charge/discharge of the parasitic capacity, after the switchover from the waiting mode to the regular mode. In short, the circuit cannot be operated for a certain period of time after the processor 100 is changed over to the regular mode.

Such temporary downtime of the processor 100 results in reduced operating speed of the entire system including the semiconductor integrated circuit.

A larger-scaled circuit experiences a greater load, resulting in the charge/discharge in a longer period of time. More specifically, a problem with the prior art circuit is that a larger-scaled circuit involves charge/discharge-caused, longer downtime when the circuit is switched over from the waiting mode to the regular mode. The problem makes it difficult to set up the waiting mode for a short period of downtime that takes places during a continuous course of action such as audio or image processing.

SUMMARY OF THE INVENTION

In view of the above, an object of the present invention is to provide a semiconductor integrated circuit operable to consume less electrical power with the help of a bias voltage-based waiting mode, and operable to eliminate downtime of the circuit after the circuit is switched over from the waiting mode to a regular mode, whereby the circuit is operated at high speed.

A first aspect of the present invention provides a semiconductor integrated circuit including a circuit block having a MOS transistor that includes a bias input terminal, a source, and a substrate, in which the bias voltage is applied to the MOS transistor at a position of at least one of the source and the substrate through the bias input terminal, a setting unit operable to set up applying timing at which the bias voltage is applied to the MOS transistor, and releasing timing at which the bias voltage is released from the MOS transistor, and a bias voltage-applying unit operable to apply the bias voltage to the MOS transistor through the bias input terminal in accordance with the applying timing and the releasing timing. In the semiconductor integrated circuit, the setting unit sets up, as the releasing timing, timing prior to activation timing by a predetermined time period. An operation-requesting signal is activated at the moment of the activation timing. The operation-requesting signal is sent out to the circuit block by the setting unit.

A second aspect of the present invention provides a semiconductor integrated circuit as defined in the first aspect of the present invention, in which the activation timing is timing at which the operation-requesting signal is rendered active.

According to each of the above structures, the discharge of the bias voltage is terminated when the circuit block is brought into regular operation in response to the activation of the operation-requesting signal, and the circuit block can be operated immediately after the operation-requesting signal is activated. Furthermore, according to each of the above constructions, the bias voltage is applied to the circuit block when the circuit block is deactivated, whereby suppressed leak current and reduced power consumption are achievable.

A third aspect of the present invention provides a semiconductor integrated circuit as defined in the first aspect of the present invention, in which the setting unit includes a counter operable to measure the predetermined time period.

A fourth aspect of the present invention provides a semiconductor integrated circuit as defined in the first aspect of the present invention, in which the setting unit includes a timer operable to measure the predetermined time period.

Each of the above structures allows the setting unit to set the releasing timing to the moment, from which there is a time difference, by a predetermined period of time, to reach the activation timing.

A fifth aspect of the present invention provides a semiconductor integrated circuit as defined in the first aspect of the present invention, in which the setting unit includes a signal-generating unit operable to generate a periodically changing periodical signal for use in the setting of the releasing timing.

The above structure allows the bias voltage to be appropriately applied to and released from a circuit block designed to alternate a certain period of operation with a short period of downtime. Furthermore, the above structure allows the circuit block to operate without allowing operating speed thereof being adversely affected.

A sixth aspect of the present invention provides a semiconductor integrated circuit as defined in the first aspect of the present invention, in which the setting unit changes the length of the predetermined time period in accordance with the magnitude of the bias voltage.

According to the above structure, the predetermined time period securely includes a bias voltage charge/discharge-requiring time period that varies according to the magnitude of the bias voltage.

A seventh aspect of the present invention provides a semiconductor integrated circuit as defined in the first aspect of the present invention, in which the bias voltage-applying unit starts the release of the bias voltage from the MOS transistor when the releasing timing is started, and terminates the release of the bias voltage at latest when the activation timing is started.

The above structure allows the circuit block to start a course of action immediately after the activation of the operation-requesting signal. As a result, the circuit block is operated at improved operating speed, even when having downtime caused by the application of the bias voltage to the circuit block.

An eighth aspect of the present invention provides a semiconductor integrated circuit as defined in the first aspect of the present invention, in which when the bias voltage is to be applied to an NMOS transistor, the bias voltage-applying unit starts the discharge of the bias voltage when the releasing timing is started, and terminates the discharge of the bias voltage at latest when the activation timing is started.

A ninth aspect of the present invention provides a semiconductor integrated circuit as defined in the first aspect of the present invention, in which when the bias voltage is to be applied to a PMOS transistor, the bias voltage-applying unit starts the charge of the bias voltage when the releasing timing is started, and terminates the charge of the bias voltage at latest when the activation timing is started.

Each of the above structures allows the bias voltage applied to the circuit block to be positively released therefrom during a period of time between the releasing timing and the activation timing. As a result, the circuit block can start a course of action immediately after the operation-requesting signal is activated.

A tenth aspect of the present invention provides a semiconductor integrated circuit as defined in the first aspect of the present invention, in which when the bias voltage is to be applied to an NMOS transistor, the bias voltage-applying unit applies, as the bias voltage, voltage higher in value than earth voltage to the NMOS transistor through the bias input terminal.

An eleventh aspect of the present invention provides a semiconductor integrated circuit as defined in the first aspect of the present invention, in which when the bias voltage is to be applied to a PMOS transistor, the bias voltage-applying unit applies, as the bias voltage, voltage lower in value than power source voltage to the PMOS transistor through the bias input terminal.

Each of the above structures provides a reduced difference in potential between the source of the MOS transistor and the drain thereof during downtime of the circuit block, thereby suppressing the leak current. As a result, the circuit block consumes less electrical power.

The above, and other objects, features and advantages of the present invention will become apparent from the following description read in conjunction with the accompanying drawings, in which like reference numerals designate the same elements.

DETAILED DESCRIPTION OF THE INVENTION

Embodiments of the present invention are now described with reference to the accompanying drawings.

First Embodiment

Figure 1:
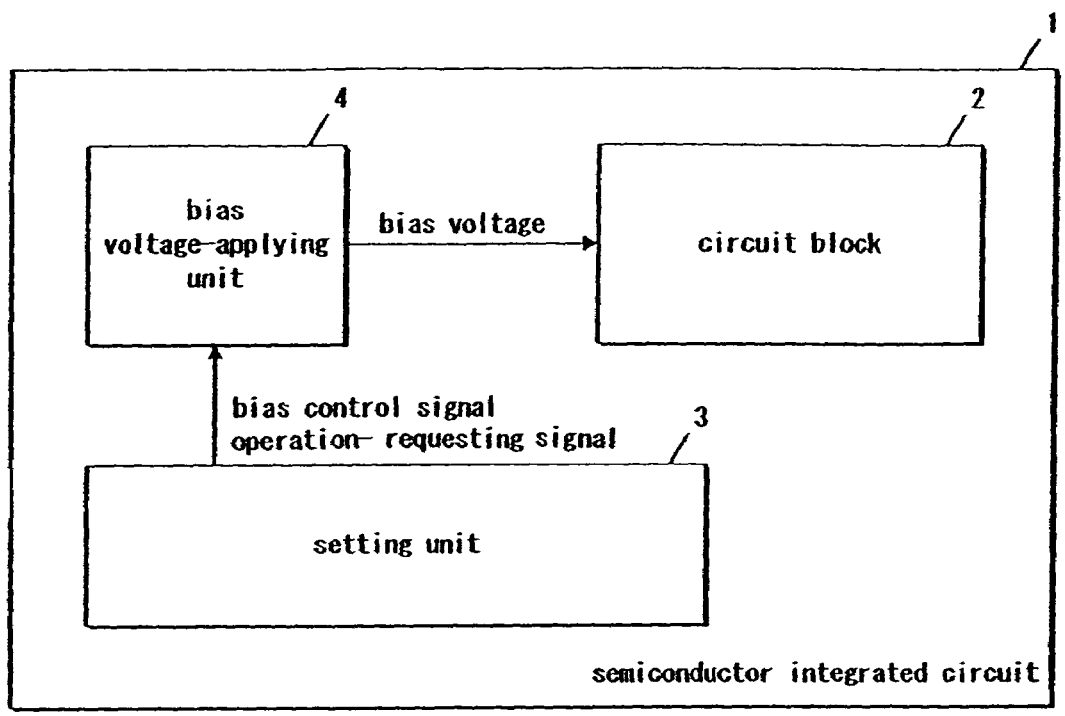
FIG. 1 is a block diagram illustrating a semiconductor integrated circuit according to a first embodiment of the present invention.
Figure 2:
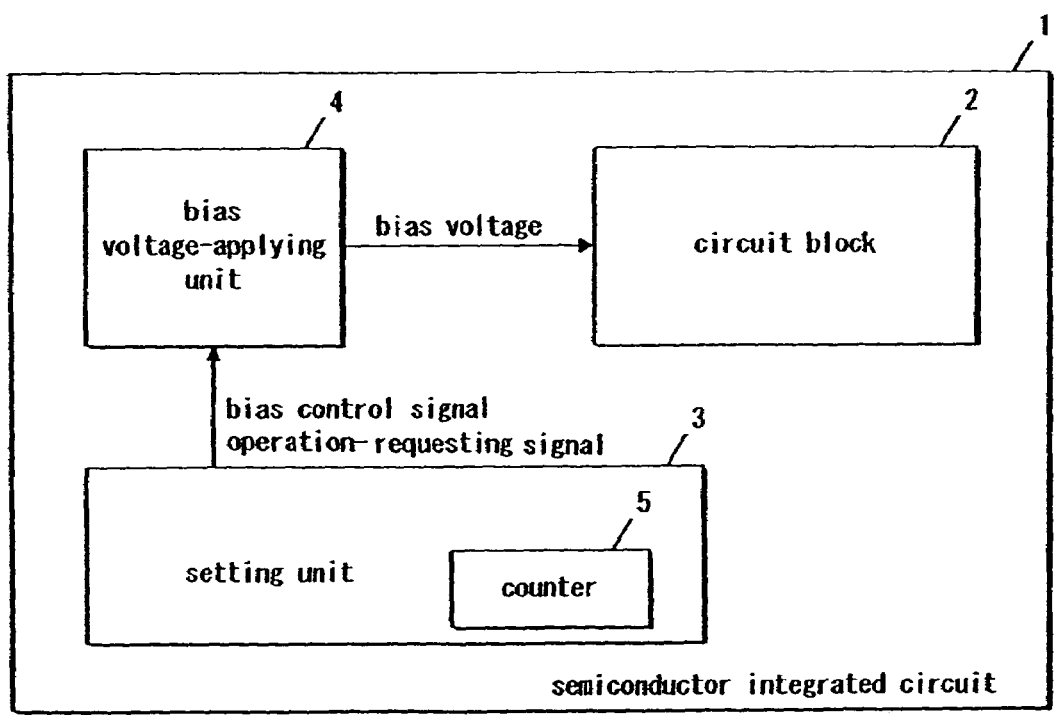
FIG. 2 is a block diagram illustrating another semiconductor integrated circuit according to the first embodiment.

Referring to FIGS. 1 and 2, a semiconductor integrated circuit according to a first embodiment of the present invention is illustrated in block diagram form.

The semiconductor integrated circuit includes a circuit block 2, a setting unit 3, and a bias voltage-applying unit 4. The setting unit 3 desirably includes a counter 5.

The circuit block 2 includes a MOS transistor. The MOS transistor includes a gate, a source, and a drain. The MOS transistor is classified into an N-type MOS transistor (hereinafter called a "NMOS transistor") and a P-type MOS transistor (hereinafter called a "PMOS transistor"), depending upon the principle upon which the MOS transistor is operated. In usual MOS transistor-based semiconductor integrated circuits, the PMOS transistor has its source connected to power source voltage, while the NMOS transistor has its source connected to the ground. The MOS transistor included in the circuit block 2 is provided with a bias input terminal at a position of at least one of the source and the substrate.

The circuit block 2 includes, e.g., a processor, a memory, and a dedicated logic circuit.

The setting unit 3 is operable to set the circuit block 2 into a "regular mode" and a "waiting mode". In the "regular mode", the circuit block 2 is operated, but is deactivated in the "waiting mode". To switch over the circuit block 2 between the regular and waiting modes, the setting unit 3 generates and feeds an operation-requesting signal into the bias voltage-applying unit 4.

In the present specification, a higher level of the operation-requesting signal represents the regular mode, while a lower level thereof does the waiting mode. Timing at which the circuit block 2 is switched over from the waiting mode to the regular mode or timing relevant to a rising edge of the operation-requesting signal is called activation timing.

The setting unit 3 is operable to set up timing at which the bias voltage is applied to the MOS transistor. In the waiting mode, the bias voltage is applied to the MOS transistor included in the circuit block 2. The setting unit 3 sets up bias voltage-applying timing and voltage-releasing timing.

The setting unit 3 sets up, as the releasing timing, timing prior to the activation timing by a predetermined time period.

The setting unit 3 feeds the operation-requesting signal, applying timing, and releasing timing as set up by the setting unit 3 into the bias voltage-applying unit 4.

The bias voltage-applying unit 4 applies the bias voltage to the MOS transistor through the bias input terminal in accordance with the applying timing as set up by the setting unit 3. Similarly, the bias voltage-applying unit 4 releases the bias voltage from the MOS transistor in accordance with the releasing timing. The bias voltage-applying unit 4 applies the bias voltage to the MOS transistor when the circuit block 2 is in the "waiting mode".

Figure 3:
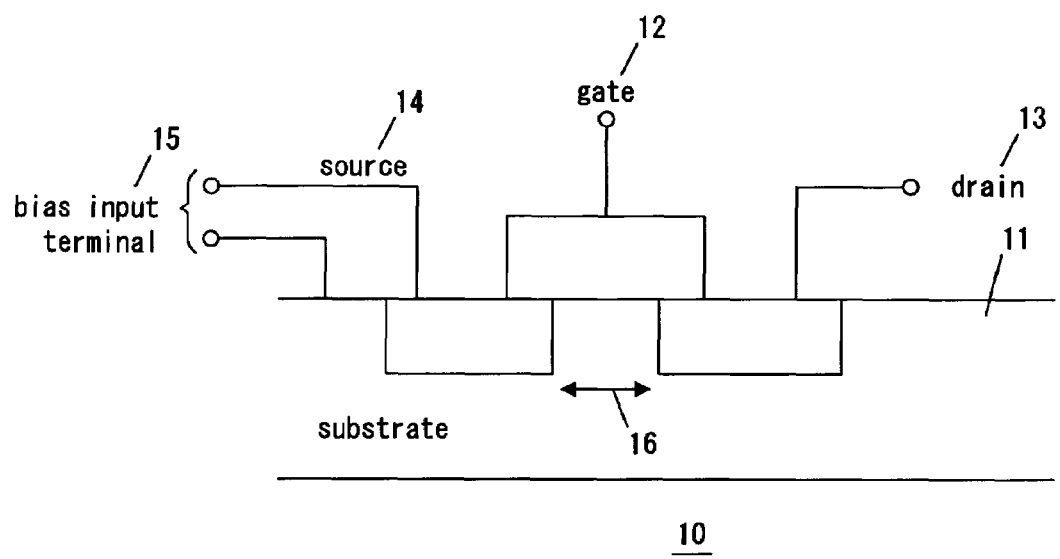
FIG. 3 is a cross-sectional view illustrating a MOS transistor according to the first embodiment.
Figure 4:
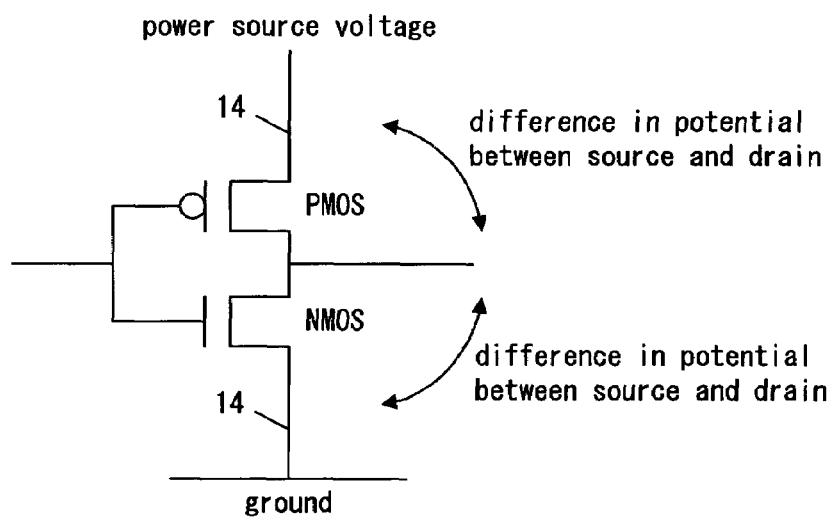
FIG. 4 is an illustration showing an equivalent circuit of the MOS transistor according to the first embodiment.

The following discusses, with reference to FIGS. 3 and 4, how the bias voltage is applied to the MOS transistor.

FIG. 3 is a cross-sectional view illustrating the MOS transistor according to the present embodiment. The MOS transistor has the substrate 11 provided as a base, and further has the gate 12, the drain 13, and the source 14 disposed on the substrate 11. The bias input terminal 15 is provided at a position of at least one of the source 14 and the substrate 11.

A source-to-drain clearance 16 is determined by the semiconductor process. According to the 65 nm process, the clearance 16 has a distance of some 65 nm in accordance with the semiconductor process.

Referring to FIG. 4, an equivalent circuit of the MOS transistor according to the present embodiment is illustrated. In FIG. 4, an inverter having the NMOS transistor combined with the PMOS transistor is shown.

As illustrated in FIG. 4, the PMOS transistor has the source 14 connected to the power source voltage. The NMOS transistor has the source 14 connected to the ground or the bias voltage.

The bias voltage is applied to the MOS transistor through the bias input terminal 15.

For the NMOS transistor, voltage higher in value than the earth voltage is applied as the bias voltage to the NMOS transistor through the bias input terminal 15. For example, bias voltage having a voltage of some 1 V is applied. At this time, when the NMOS transistor has an operating voltage 2.5 V, a difference in potential between the NMOS transistor source and drain is 1.5 V, which is a difference between the operating voltage of 2.5 V and the bias voltage of 1 V. When no bias voltage is applied to the NMOS transistor, a difference in potential between the source and the drain is 2.5 V. It follows that when the bias voltage is applied to the NMOS transistor, a difference in potential between the source and the drain is smaller than that when no bias voltage is applied thereto. As a result, suppressed leak current occurs between the source and the drain.

For the PMOS transistor, bias voltage having a voltage lower than the power source voltage is applied to the PMOS transistor through the bias input terminal 15. Assume that the bias voltage is 1.5 V, and the drain voltage is 0V (i.e., ground). In this instance, a difference in potential between the PMOS transistor source and drain is 1.5 V (i.e., bias voltage [1.5 V]–drain voltage [0V]=1.5 V), which is smaller than a potential difference when no bias voltage is applied to the PMOS transistor. This means that the application of the bias voltage to the PMOS transistor provides a reduced difference in potential between the PMOS transistor source and drain, thereby suppressing the leak current that occurs between the source and the drain.

The bias voltage thus applied to the MOS transistor provides suppressed leak current that occurs between the MOS transistor source and drain, whereby the semiconductor integrated circuit 1 consumes reduced electrical power.

The bias voltage as discussed above has an exemplified value, and may have a value appropriately determined in accordance with a relationship between the bias voltage and a MOS transistor operating voltage.

Figure 5:
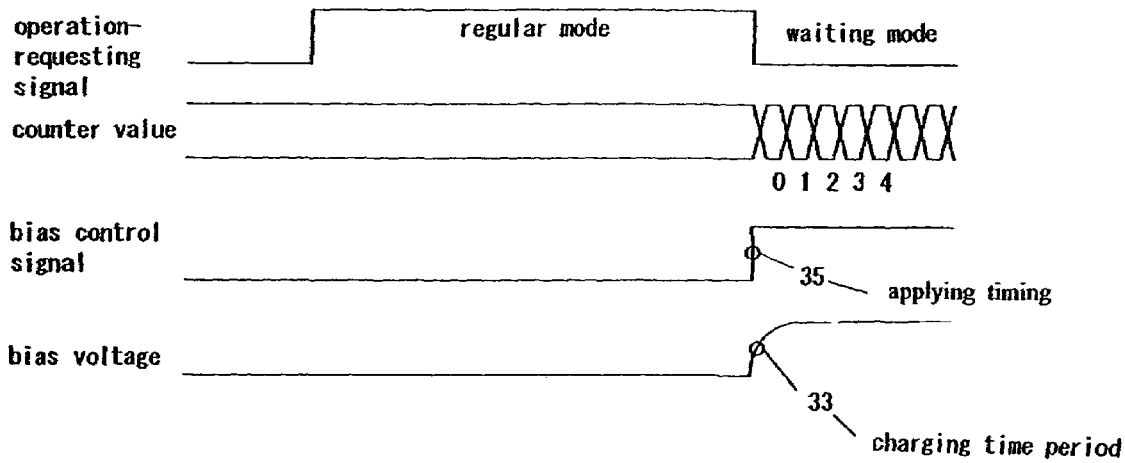
FIG. 5 is a timing chart illustrating a course of action provided by the semiconductor integrated circuit according to the first embodiment.
Figure 6:
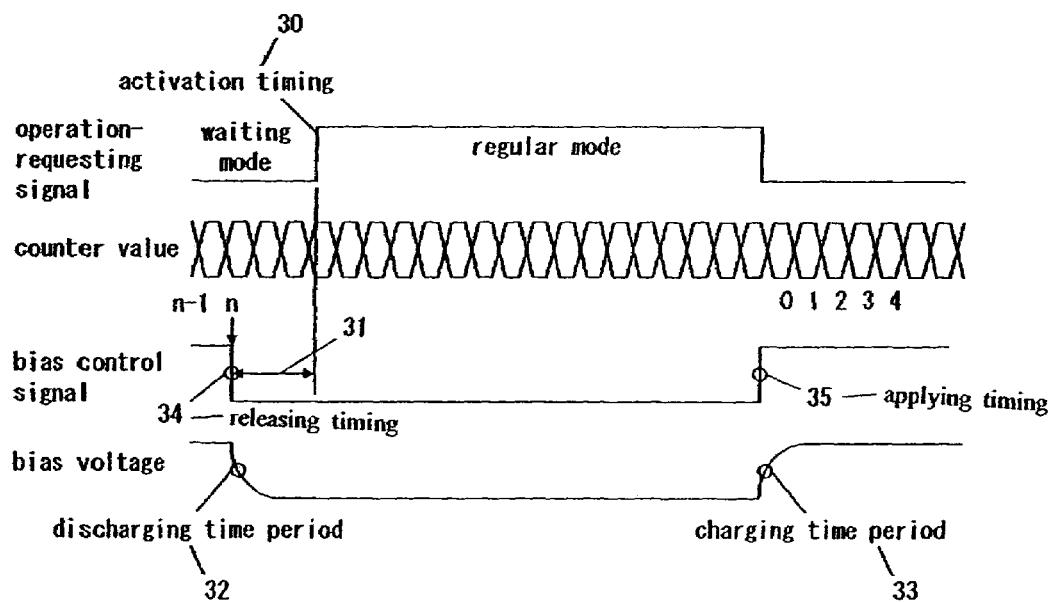
FIG. 6 is a timing chart illustrating another course of action provided by the semiconductor integrated circuit according to the first embodiment.

The following discusses, with reference to FIGS. 5 and 6, a course of set-up processing provided by the setting unit 3, and a course of temporal processing based on the course of set-up processing as just discussed, to apply the bias voltage to the MOS transistor.

Referring to FIGS. 5 and 6, each course of action provided by the semiconductor integrated circuit according to the present embodiment is illustrated in timing chart format. The following is premised on that the bias voltage is applied to the NMOS transistor. This means that, in the waiting mode, voltage higher in value than the earth voltage is applied to the NMOS transistor through the bias input terminal 15.

The operation-requesting signal requests the circuit block 2 to assume the "regular mode" and the "waiting mode. As illustrated in FIG. 5, for a higher level of the operation-requesting signal, the circuit block 2 is in the regular mode, but is in the waiting mode for a lower level of the operation-requesting signal. The rising edge at which the operation-requesting signal is switched over from the waiting mode to the regular mode is defined as activation timing 30.

The setting unit 3 sets up the applying timing at which the bias voltage is applied to the circuit block 2, and the releasing timing at which the bias voltage is released therefrom. The setting unit 3 generates the applying and releasing timing as a "bias control signal" as illustrated in FIGS. 5 and 6, and feeds the generated bias control signal to the bias voltage-applying unit 4. In the bias control signal, a rising edge or timing at which the bias control signal is changed over from a lower level to a higher level is represented as the applying timing 35, while a trailing edge or timing at which the bias control signal is changed over from the higher level to the lower level is represented as the releasing timing 34.

The setting unit 3 sets up, as the releasing timing 34, timing prior to the activating timing 30 by a predetermined time period 31. The activation timing 30 is timing that elapses from the releasing timing 34 by the predetermined time period 31. In short, the setting unit 3 initially sets up the releasing timing 34, and then sets up the activation timing 30 after the predetermined time period 31 elapses from the releasing timing 34 as previously set by the setting unit 3. The predetermined time period 31 is included in an elapsed time of the waiting mode in which the bias voltage is applied.

The length of the predetermined time period 31 is settable to any extent by the setting unit 3. The setting unit 3 changes the length of the predetermined time period 31 in accordance with the magnitude of the bias voltage applied to the circuit block 2. The bias voltage with a greater value needs a longer period of time to be charged and discharged, and the predetermined time period 31 is increased in length for the increased bias voltage.

The counter 5 is operable to count a predetermined number as a counter value. For example, the counter 5 measures, as the counter value, a predetermined value based on the applying timing 35. The setting unit 3 sets up the releasing timing 34 and the activation timing 30 on the basis of the counter value. In short, the counter 5 measures the predetermined time period 31. The setting unit 3 sets up the releasing timing 34 on the basis of the predetermined time period 31 measured by the counter 5.

Alternatively, the counter 5 generates a periodical signal in accordance with the measured counter value. The periodical signal is periodically generated at definite time intervals. It is also preferred that the setting unit 3 sets up the releasing timing 34 in accordance with the periodical signal. For example, the setting unit 3 may send out the bias control signal while sending out the periodical signal directly as the releasing timing 34. As illustrated in FIGS. 5 and 6, the releasing timing 34 is timing prior to the activation timing 30 by the predetermined time period 31.

It is still preferred that the setting unit 3 sets up the applying timing 35 and the activation timing 30 in accordance with the periodical signal.

For example, assuming that the circuit block 2 is constructed to periodically alternate data transfer with deactivation, the periodical signal-based setting of the applying timing and releasing timing as discussed above allows for a periodical switchover of the circuit block 2 between the regular mode and the waiting mode, with a consequential reduction in power consumption.

The bias voltage-applying unit 4 applies the bias voltage to the MOS transistor through the bias input terminal 15 in response to the bias control signal including both of the applying timing 35 and the releasing timing 34.

As illustrated in FIGS. 5 and 6, a bias voltage-charging time period 33 is required to apply the bias voltage to the MOS transistor, but a bias voltage-discharging time period 32 is required to release the bias voltage therefrom.

When the releasing timing is nearly coincident with the activation timing 30, the circuit block 2 cannot start a course of action in practice during the bias voltage-discharging time period 32. More specifically, when being switched over from the activation timing 30 to the regular mode in practice, the circuit block 2 is delayed in operation because of a time difference accompanied by the discharging time 32.

As evidenced by FIG. 6, the discharge of the bias voltage is terminated during a period of time between the releasing timing 34 and the activation timing 30. In other words, the predetermined time period 31 includes a period of time in which the discharging time period 32 is secured. As a result, the release of the bias voltage is terminated during a period of time in which the circuit block 2 is in the waiting mode.

When the bias voltage is to be applied to the PMOS transistor, the charge of the bias voltage is started at the moment of the releasing timing 34, and is terminated by the time when the activation timing 30 is started.

As described above, the setting unit 3 sets, as the bias voltage-releasing timing 34, the timing prior to the activation timing 30 by the predetermined time 31, whereby the circuit block 2 can start a course of action immediately after the activation timing 30. As a result, high-speed operating time of the circuit block 2 is achievable. In particular, the circuit block 2 need not be deactivated after being switched over from the waiting mode to the regular mode, and can be switched over to the waiting mode, even with a short period of downtime of the circuit block 2. The downtime is caused by the specification of the circuit block 2.

For example, assuming that the circuit block 2 is designed to alternate a certain period of data acquisition with a short period of downtime, the circuit block 2 can be switched over to the waiting mode for each short period of downtime. This feature provides suppressed leak current and reduced power consumption. Furthermore, since the release of the bias voltage is terminated when the circuit block 2 is switched over from the waiting mode to the regular mode, the circuit block 2 is operated without allowing operating speed thereof to be adversely affected.

As practiced by the prior art, if the bias voltage is released from the circuit block 2 after the circuit block 2 is switched over to the regular mode, errors are likely to occur at the beginning of data acquisition. In contrast, the semiconductor integrated circuit according to the present invention eliminates such a problem. According to the prior art that involves an increased likelihood of the occurrence of the errors, it is difficult to switch over the circuit block 2 to the waiting mode during a short period of downtime of the circuit block 2. Therefore, the prior art is insufficient to provide reduced power consumption.

As can be seen from the above, the semiconductor integrated circuit according to the present invention can reduce power consumption while keeping high-speed operating time.

The semiconductor integrated circuit according to the present invention provides proper set-up of the waiting mode during both periodically appearing downtime of the circuit block and non-periodically appearing downtime thereof.

Second Embodiment

A second embodiment is now described.

Figure 7:
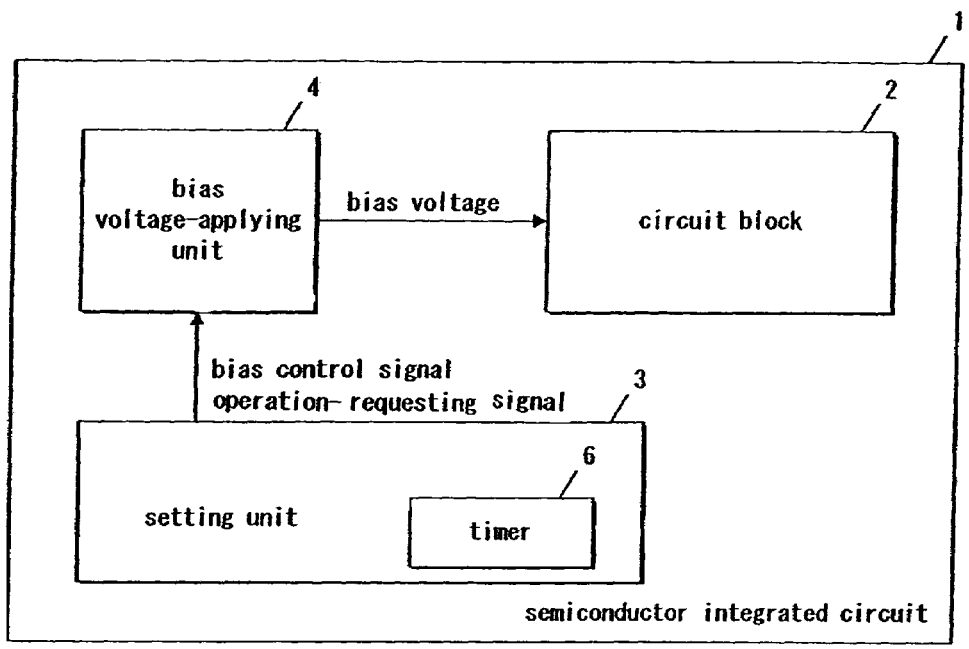
FIG. 7 is a block diagram illustrating a semiconductor integrated circuit according to a second embodiment.

Referring to FIG. 7, a semiconductor integrated circuit according to the present embodiment is illustrated in block diagram form.

In the semiconductor integrated circuit 1 according to the present embodiment, a setting unit 3 includes a timer 6.

The timer 6 is operable to measure an arbitrarily determined time period, and operable to measure any timing. The setting unit 3 is operable to set up both releasing timing and applying timing based on the measured timing from the timer 6.

Figure 8:
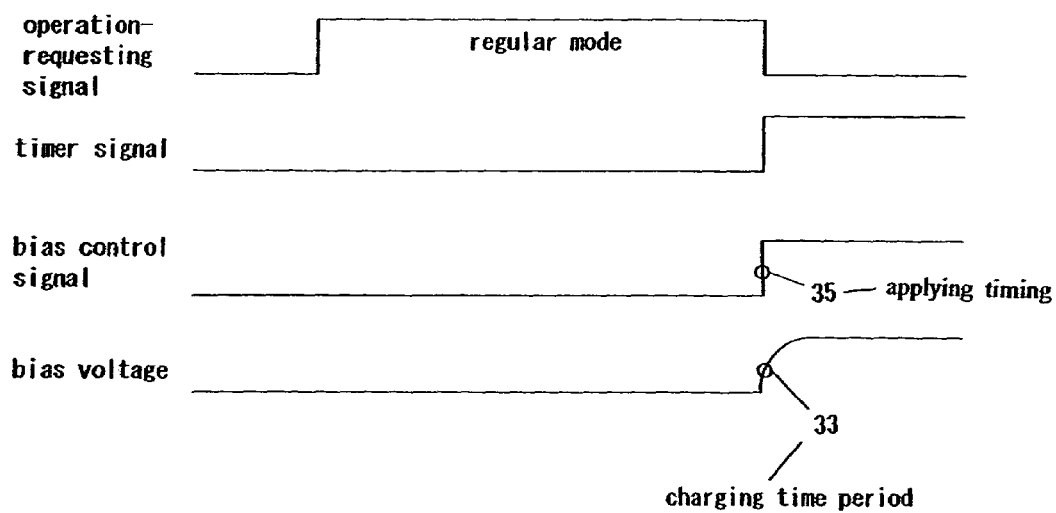
FIG. 8 is a timing chart illustrating a course of action provided by the semiconductor integrated circuit according to the second embodiment.
Figure 9:
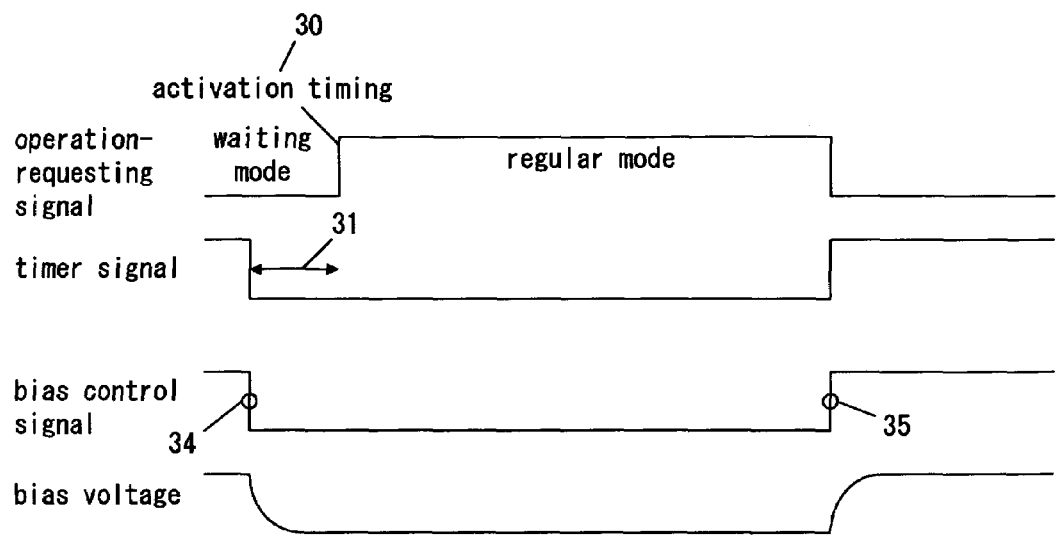
FIG. 9 is a timing chart illustrating another course of action provided by the semiconductor integrated circuit according to the second embodiment.

Referring now to FIGS. 8 and 9, each course of action provided by the semiconductor integrated circuit according to the present embodiment is illustrated in timing chart format. Similarly to FIGS. 5 and 6, FIGS. 8 and 9 illustrate how the bias voltage is applied to an NMOS transistor.

A higher level of operation-requesting signal represents a regular mode, while a lower level thereof does a waiting mode. In the regular mode, a circuit block is operated, but is deactivated in the waiting mode. In the waiting mode, the bias voltage is applied to the deactivated circuit block. Activation timing 30 is timing at which the operation-requesting signal rises. The activation timing 30 allows the circuit block to be switched over from the waiting mode to the regular mode.

A bias control signal includes the releasing timing 34 and the applying timing 35 as set by the setting unit 3. The releasing timing 34 is timing prior to the activation timing 30 by a predetermined time period 31.

The semiconductor integrated circuit 1 according to the present embodiment uses a timer signal as the bias control signal. The timer signal is generated by the timer 6. The timer 6 measures the predetermined time period 31, thereby generating timing that corresponds to the releasing timing 34. Similarly, the timer 6 generates, in accordance with an operation-requesting signal, timing corresponding to the applying timing 35. The setting unit 3 sets up both of the releasing timing 34 and the applying timing 35 in accordance with the timer signal, and notifies the bias voltage-applying unit 4 of the set releasing timing and applying timing 34, 35 as the bias control signal.

The timer 6 measures arbitrarily determined timing, and measures, as the releasing timing 34, the timing prior to the activation timing 30 by the predetermined time period 31. At this time, the timer 6 arbitrarily measures the timing corresponding to the applying timing 35.

The setting unit 3 sets up any length of the predetermined time period 31. At this time, the setting unit 3 changes the length of the predetermined time period 31 in accordance with the magnitude of the bias voltage applied to the circuit block 2. The bias voltage with a greater value needs a longer period of time to be charged and discharged, and the predetermined time period 31 is increased for the increased bias voltage.

When the setting unit 3 sets up the releasing timing 34 based on the timer signal, then the bias voltage-applying unit 4 starts releasing the bias voltage from the circuit block 2 at the moment of the releasing timing 34. In FIG. 9, the bias voltage is to be applied to the NMOS transistor, and the bias voltage is released from the NMOS transistor by the discharge of the applied bias voltage. The discharge of the bias voltage is terminated during the predetermined time period 31. More specifically, the discharge of the bias voltage is started at the moment of the releasing timing 34, and is terminated by the time when the activation timing 30 is started. The activation timing 30 is reached after the discharge of the bias voltage is terminated, and the circuit block 2 is thereby changed over from the waiting mode to the regular mode. As a result, the circuit block 2 can start a course of action immediately after the activation timing 30, and the circuit block 2 is operated at high speed.

When the bias voltage is to be applied to the PMOS transistor, inverted timing charts are provided with reference to the bias voltage timing charts of FIGS. 8 and 9. More specifically, the charge of the bias voltage is started at the moment of the releasing timing 34, and is terminated by the time when the activation timing 30 is started, whereby the switchover of the circuit block 2 from the waiting mode to the regular mode is completed.

As described above, the setting unit 3 sets up, as the bias voltage-releasing timing 34, the timing prior to the activation timing 30 by the predetermined time period 31, and the circuit block 2 can start a course of action immediately after the activation timing 30. As a result, high-speed operating time of the circuit block 2 is achievable. In particular, the circuit block 2 need not be deactivated after being changed over from the waiting mode to the regular mode, and can be changed over to the waiting mode, even with a short period of downtime of the circuit block 2.

As may be seen from the above, the semiconductor integrated circuit according to the present invention can reduce power consumption while keeping high-speed operating time.

The semiconductor integrated circuit 1 according to the present invention is applicable to a variety of electronic apparatuses.

Figure 10:
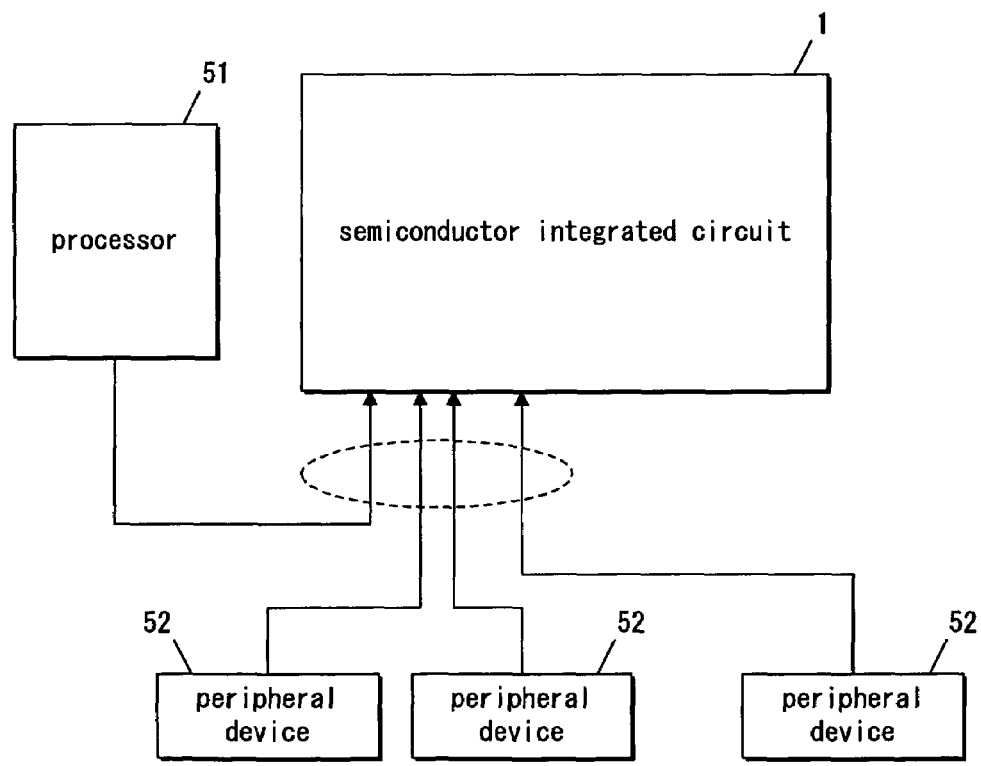
FIG. 10 is a block diagram illustrating an electronic apparatus according to the second embodiment.
Figure 11:
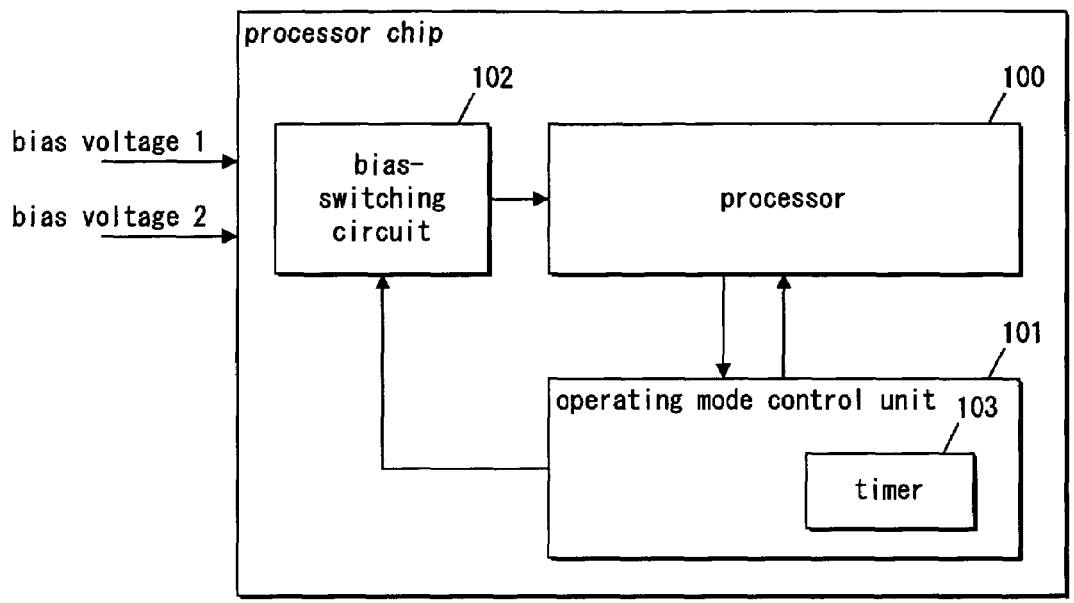
FIG. 11 is a block diagram illustrating a prior art semiconductor integrated circuit.
Figure 12:
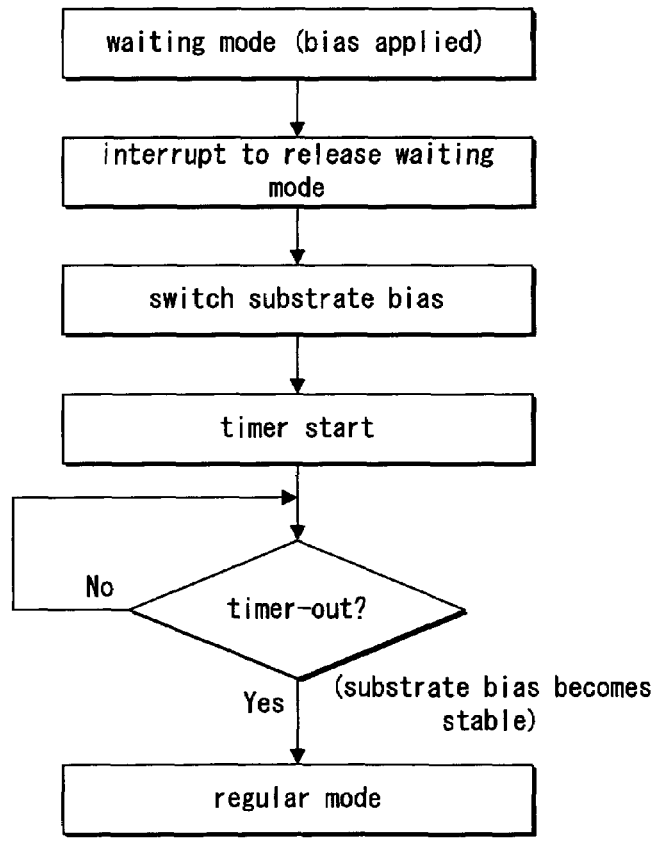
FIG. 12 is a flowchart illustrating a course of action provided by the prior art semiconductor integrated circuit.

Turning now to FIG. 10, an electronic apparatus according to the present embodiment is illustrated in block diagram form.

The electronic apparatus 50 includes a semiconductor integrated circuit 1, a processor 51, and peripheral devices 52. The semiconductor integrated circuit 1 provides a predetermined course of action in response to a request from each of the peripheral devices 52. At this time, the semiconductor integrated circuit 1 provides downtime either periodically or non-periodically, depending upon a request from each of the peripheral devices 52.

In the electronic apparatus 50 thus configured, the semiconductor integrated circuit 1 assumes the waiting mode during the downtime, and therefore consumes less electrical power. In addition, the semiconductor integrated circuit 1 is switched over from the waiting mode to the regular mode without allowing operating speed thereof to be adversely affected, and the semiconductor integrated circuit 1 is operated at high speeds, even when being changed over to the waiting mode.

The electronic apparatus as described herein includes those highly required to consume less electrical power, such as cellular phones, notebook-sized computers, and office automation equipment.

Pursuant to the present invention, the release (charge/discharge) of the bias voltage at the time of a changeover of the circuit block from the waiting mode to the regular mode is terminated by the time when the activation mode is started, at which the circuit block is switched over from the waiting mode to the regular mode. This feature permits the circuit block 2 to start a course of action immediately after being switched over to the regular mode. As a result, the circuit block 2 is operated at high speed.

Furthermore, since the circuit block 2 can be operated immediately after being switched over from the waiting mode to the regular mode, an easy switchover of the circuit block 2 to the waiting mode at which the bias voltage is applied thereto is achievable, even with a short period of downtime of the circuit block 2. This feature provides reduced leak current and reduced power consumption.

In particular, the circuit block 2 provides an easy changeover to the waiting mode, even with a short period of the downtime of the circuit block 2, and a circuit designed to alternate a certain period of operation with a very short period of downtime is easy to reduce electrical power consumption as well.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor integrated circuit comprising:
   a circuit block comprising a MOS transistor having a bias input terminal, a source, and a substrate, said MOS transistor being operable to receive a bias voltage applied through said bias input terminal to at least one of said source and said substrate;
   a setting unit operable to set applying timing, including a time at which the bias voltage is applied to said MOS transistor, and operable to set releasing timing, including a time at which the bias voltage is released from said MOS transistor; and
   a bias voltage-applying unit operable to apply the bias voltage to said MOS transistor through said bias input terminal according to the applying timing and the releasing timing,
   wherein said setting unit is operable to set the releasing timing to include a time at which the bias voltage is released prior to, by a predetermined time period, an activation time included in activation timing, and
   wherein an operation-requesting signal for controlling an operation state of said circuit block is transmitted to said circuit block by said setting unit at an activation time included in the activation timing.

2. The semiconductor integrated circuit as defined in claim 1, wherein the activation timing includes a time at which the operation-requesting signal is rendered active.

3. The semiconductor integrated circuit as defined in claim 1, wherein said setting unit comprises a counter operable to measure the predetermined time period.

4. The semiconductor integrated circuit as defined in claim 1, wherein said setting unit comprise a timer operable to measure the predetermined time period.

5. The semiconductor integrated circuit as defined in claim 1, wherein said setting unit comprises a signal-generating unit operable to generate a periodically changing periodical signal for setting the releasing timing.

6. The semiconductor integrated circuit as defined in claim 1, wherein said setting unit changes a length of the predetermined time period according to a magnitude of the bias voltage.

7. The semiconductor integrated circuit as defined in claim 1, wherein said bias voltage-applying unit starts a release of the bias voltage at a time of the releasing timing, and terminates the release of the bias voltage, at latest, at a time of the activation timing.

8. The semiconductor integrated circuit as defined in claim 1, wherein, if the bias voltage is to be applied to an NMOS transistor, said bias voltage-applying unit starts discharge of the bias voltage at a time of the releasing timing, and said bias voltage-applying unit terminates the discharge of the bias voltage, at latest, at a time of the activation timing.

9. The semiconductor integrated circuit as defined in claim 1, wherein, if the bias voltage is to be applied to a PMOS transistor, said bias voltage-applying unit starts charge of the bias voltage at a time of the releasing timing, and said bias voltage-applying unit terminates the charge of the bias voltage, at latest, at a time of the activation timing.

10. The semiconductor integrated circuit as defined in claim 1, wherein, if the bias voltage is to be applied to an NMOS transistor, said bias voltage-applying unit applies, as the bias voltage, a voltage higher in value than earth voltage to the NMOS transistor through said bias input terminal.

11. The semiconductor integrated circuit as defined in claim 1, wherein, if the bias voltage is to be applied to a PMOS transistor, said bias voltage-applying unit applies, as the bias voltage, a voltage lower in value than a power source voltage to the PMOS transistor through said bias input terminal.

12. The semiconductor integrated circuit as defined in claim 1, wherein the bias voltage is applied to said circuit block when said circuit block is rendered inoperative.

13. The semiconductor integrated circuit as defined in claim 1, wherein said setting unit comprises a counter operable to measure the predetermined time period and operable to generate a periodical signal according to the measured predetermined time period and at predetermined time intervals.

* * * * *